United States Patent
Masuda et al.

(10) Patent No.: US 6,815,365 B2
(45) Date of Patent: Nov. 9, 2004

(54) PLASMA ETCHING APPARATUS AND PLASMA ETCHING METHOD

(75) Inventors: Toshio Masuda, Toride (JP); Kazue Takahashi, Kudamatsu (JP); Mitsuru Suehiro, Kudamatsu (JP); Tetsunori Kaji, Tokuyama (JP); Saburo Kanai, Hikari (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/983,946

(22) Filed: Oct. 26, 2001

(65) Prior Publication Data

US 2002/0042206 A1 Apr. 11, 2002

Related U.S. Application Data

(63) Continuation of application No. 09/421,044, filed on Oct. 20, 1999, which is a division of application No. 09/227,332, filed on Jan. 8, 1999, now Pat. No. 6,171,438, which is a continuation-in-part of application No. 08/611,758, filed on Mar. 8, 1996, now Pat. No. 5,874,012.

(30) Foreign Application Priority Data

Mar. 16, 1995 (JP) .............................. 7-57472

(51) Int. Cl.[7] ........................................... H01L 21/302
(52) U.S. Cl. ...................... 438/710; 438/714; 438/715; 216/68
(58) Field of Search .............................. 438/706, 707, 438/710, 714, 723; 156/345; 215/67–69

(56) References Cited

U.S. PATENT DOCUMENTS

| | | | | |
|---|---|---|---|---|
| 4,209,357 A | * | 6/1980 | Gorin et al. | 156/643 |
| 5,272,417 A | | 12/1993 | Ohmi | |
| 5,283,414 A | | 2/1994 | Straemke | 219/121.43 |
| 5,290,381 A | | 3/1994 | Nozawa et al. | 156/345.27 |

(List continued on next page.)

FOREIGN PATENT DOCUMENTS

| DE | 40 07 123 A1 | 9/1991 |
|---|---|---|
| EP | 0 488 307 A2 | 6/1992 |

(List continued on next page.)

OTHER PUBLICATIONS

"Suppression Shield for RF Plasma", W. J. Curry et al, IBM Technical Disclosure Bulletin, vol. 22, No. 11, Apr. 1980, pp 4909–4910.

*Primary Examiner*—Duy-Vu Deo
(74) *Attorney, Agent, or Firm*—Antonelli, Terry, Stout & Kraus, LLP

(57) ABSTRACT

A plasma etching method for etching a sample within an etching chamber having a sidewall, an exchangeable jacket which is held inside of the sidewall, and a heating mechanism proximate to top end of the exchangeable jacket for generating heat which radiates towards an inside of the etching chamber. The plasma etching method further including a step of evacuating the etching chamber by an evacuation system, a step of supplying an etching gas into the etching chamber, a step of generating a plasma for performing etching of the sample in the etching chamber, and a step of conducting a heating operation by the heating mechanism during an initial stage of the step of generating a plasma.

10 Claims, 9 Drawing Sheets

U.S. PATENT DOCUMENTS

| | | | |
|---|---|---|---|
| 5,356,672 A | 10/1994 | Schmitt, III et al. ........ 427/466 |
| 5,362,361 A | 11/1994 | Tatsumi ....................... 216/67 |
| 5,366,585 A | 11/1994 | Robertson et al. ............ 216/67 |
| 5,445,709 A | 8/1995 | Kojima et al. |
| 5,478,429 A | 12/1995 | Komino et al. |
| 5,531,834 A | 7/1996 | Ishizuka et al. |
| 5,591,493 A | 1/1997 | Paranjpe et al. |
| 5,647,945 A | 7/1997 | Matsuse et al. |
| 5,651,826 A | 7/1997 | Takagi |
| 5,716,451 A | 2/1998 | Hama et al. |
| 5,756,400 A | 5/1998 | Ye et al. |
| 5,800,621 A | 9/1998 | Redeker et al. |
| 5,846,331 A | 12/1998 | Miyamoto |
| 5,874,012 A * | 2/1999 | Kanai et al. .................. 216/67 |
| 5,891,252 A | 4/1999 | Yokogawa et al. |
| 6,024,826 A | 2/2000 | Collins et al. |
| 6,054,013 A | 4/2000 | Collins et al. |
| 6,055,927 A | 5/2000 | Shang et al. |
| 6,068,784 A | 5/2000 | Collins et al. |
| 6,074,518 A | 6/2000 | Imafuku et al. |
| 6,171,438 B1 * | 1/2001 | Masuda et al. .............. 156/345 |

FOREIGN PATENT DOCUMENTS

| | | | | |
|---|---|---|---|---|
| EP | 0 488 307 B1 | 6/1992 | | |
| EP | 0 272 140 B1 | 2/1994 | | |
| EP | 0 367 289 B1 | 2/1995 | | |
| EP | 0 467 397 B1 | 12/1995 | | |
| EP | 0 688 037 B1 | 12/1995 | | |
| EP | 0 734 047 A2 | 9/1996 | | |
| JP | 56-67925 | 6/1981 | | |
| JP | 57-23228 | 2/1982 | | |
| JP | 58-153332 | 9/1983 | | |
| JP | 6-224153 | 8/1984 | | |
| JP | 59-144132 | 8/1984 | | |
| JP | 62-95828 | 5/1987 | | |
| JP | 62-218570 | 8/1987 | | |
| JP | 62-218570 | 9/1987 | | |
| JP | 63-5526 | 1/1988 | | |
| JP | 63-75034 | 5/1988 | | |
| JP | 1-208449 | * 8/1989 | ........... C23C/14/22 |
| JP | 1-220447 | 9/1989 | | |
| JP | 3-64025 | 3/1991 | | |
| JP | 3-104222 | * 5/1991 | ......... H01L/21/302 |
| JP | 4-184924 | 7/1992 | | |
| JP | 4-214873 | 8/1992 | | |
| JP | 5-60256 | 3/1993 | | |
| JP | 5-211125 | 8/1993 | | |
| JP | 5-266845 | 10/1993 | | |
| JP | 5-275385 | 10/1993 | | |
| JP | 6-188220 | 7/1994 | | |
| JP | 6-196410 | 7/1994 | | |
| JP | 7-22404 | 1/1995 | | |
| JP | 7-147247 | 6/1995 | | |
| JP | 7-312363 | 11/1995 | | |
| JP | 8-51099 | 2/1996 | | |
| JP | 8-144072 | 6/1996 | | |
| JP | 8-186093 | 7/1996 | | |
| JP | 8-264515 | 10/1996 | | |
| JP | 8-316205 | 11/1996 | | |
| JP | 9-157832 | 5/1997 | | |
| JP | 9-157832 | 6/1997 | | |
| JP | 9-275092 | 10/1997 | | |
| JP | 10-088271 | 4/1998 | | |

* cited by examiner

ION

PLASMA ETCHING APPARATUS AND PLASMA ETCHING METHOD

CROSS REFERENCE TO RELATED APPLICATION

This application is a continuation application of U.S. Ser. No. 09/421,044, filed Oct. 20, 1999, which is a divisional application of U.S. Ser. No. 09/227,332, filed Jan. 8, 1999 now U.S Pat. No. 6,171,438, which is a continuation-in-part application of to U.S. application Ser. No. 08/611,758, entitled "Plasma Processing Apparatus and Plasma Processing Method", filed Mar. 8, 1996, now U.S. Pat. No. 5,874,012, by some of the inventors herein, the subject matter of the aforementioned application being incorporated by reference herein.

BACKGROUND OF THE INVENTION

The present invention relates to a plasma etching apparatus and etching method and, more particularly, to a plasma etching apparatus and etching method suitable for forming a fine pattern in the semiconductor manufacture process.

In the semiconductor manufacture process, the plasma etching apparatus is widely used in the fine processing processes, for example, such as film deposition, etching, and ashing. The process by plasma etching performs the predetermined process by making processing gas introduced into the vacuum chamber (reactor) plasmatic by the plasma generation means, performing the fine processing by making it react on the surface of a semiconductor wafer, and discharging volatile reaction products.

In this plasma etching process, the temperatures of the inner wall of the reactor and wafer and the deposition status of reaction products on the inner wall greatly affect the process. If reaction products deposited inside the reactor are peeled off, dust may be caused, resulting in deterioration of the element characteristics and reduction of the yield.

Therefore, in the plasma etching apparatus, to keep the process stable and control generation of foreign substances, it is important to control the temperature in the reactor and deposition of reaction products on the surface.

For example, in Japanese Patent Application Laid-Open 8-144072, for the purpose of improving the selection ratio in the dry etching process of a silicon oxide film, a dry etching apparatus for controlling and holding the temperature of each unit inside the reactor at a high temperature within a range of 150° C. to 300° C. (desirably from 200° C. to 250° C.) which is higher than the temperature at the etching stage of 150° C. or more with the accuracy of less than ±5° C. is described. When the temperature of each unit of the inner surface of the reactor is increased and controlled at a high value by heating like this, the deposited amount of plasma polymeric products on the inner surface of the reactor reduces, and the deposited amount of plasma polymeric products on a semiconductor wafer increases, and the selection improves.

In Japanese Patent Application Laid-Open 5-275385, a parallel plate type plasma etching apparatus in which a heating means for increasing and keeping the temperature so that reaction products generated by the plasma etching will not be deposited is installed on at least one of the clamp ring (workpiece holding means) and focus ring (plasma centralization means) is described. As a heating means, a resistance heating element is used. Deposition of reaction products can be prevented by heating, so that peeling of reaction products and deposition of particles on the surface of a workpiece can be reduced.

As mentioned above, in the plasma etching apparatus, it is important to control the temperature of the surface of the inner wall of the chamber and deposition of reaction products on the surface of the inner wall.

However, when the temperature of the inner wall surface of the chamber, particularly the temperature of the side wall surface having a wide area is set to a high value between 200° C. and 250° C. or more, the etching characteristic becomes very sensitive to the temperature of the inner wall surface and a problem arises that the reproducibility and reliability of the process are apt to reduce.

For example, in S. C. McNevin, et al., J. vac. Sci. Technol. B 15(2) Mar/Apr 1997, p. 21, Chemical challenge of submicron oxide etching', it is indicated that when the side wall temperature changes from 200° C. to 170° C. in inductive coupling plasma, the oxide film etching rate increases more than 5%. As a reason, it is inferred that since the side wall temperature lowers, much more carbon is adsorbed into the wall, and deposition of carbon on a wafer reduces, and the oxide film etching rate increases. As mentioned above, since high density plasma, particularly, performs a strong interaction with the inner wall of the reactor in the high temperature zone, deposition of reaction products on the inner wall surface and composition change of the surface proceed rapidly due to a change in the temperature balance inside the reactor and appear as a change in the etching characteristic.

Furthermore, in the high temperature zone, the aforementioned interaction between the plasma and the inner wall becomes very sensitive to a change in temperature. For example, when $SiO_2$ is used as a material of the inner wall surface, a thermodynamic relationship between the etching rate by F atoms of $SiO_2$ and the wall temperature is reported (D. L. Flamm, et al., J. Appl. Phys., 50, p. 6211 (1979)), and when this relationship is applied to a temperature zone of more than 150° C., the etching rate rapidly increases exponentially when the wall temperature is between 200° C. and 250° C. or more.

Therefore, in such a high temperature zone, the temperature control requires high accuracy such as ±5° C. max. However, the inner wall surface is exposed to high density plasma, so that it is not easy to control the wall surface temperature with high accuracy in such a high temperature zone. To realize it, a temperature detection means and a heating means such as a heater and lamp are used for temperature control, though the temperature control mechanism and means are largely scaled. Furthermore, in such a high temperature zone, reaction products are not deposited on the inner wall surface, so that the wall surface is etched and consumed by plasma. Therefore, it is necessary to periodically exchange the parts of the inner wall surface and an increase in the cost of expendable supplies results. Heating requires large energy, thus the high temperature zone is not desirable also from a viewpoint of energy consumption.

The same problem is imposed also by heating the ring around a wafer and the electrode. When the ring is heated to increase the temperature thereof, deposition of reaction products can be prevented, though the heating mechanism such as the resistance heating element makes the equipment constitution complex. When the ring and inner wall surface are etched and consumed by plasma even if deposition of reaction products can be prevented, there is the possibility that the constitution material itself will become a new dust source. Furthermore, when the parts of the ring and inner wall surface are consumed, it is necessary to periodically exchange them and the running cost of the equipment increases.

One method for solving such a problem is to protect the inner wall surface of the chamber by a surface coating layer of a polymer. For example, in Japanese Patent Application Laid-Open 7-312363, a plasma etching apparatus for keeping the temperature of the workpiece (article to be processed) holder higher than that of the wall surface of the chamber and forming a surface coating layer on the inner wall surface of the chamber is described. By catching and storing contaminant particles in a polymer film, remaining and storing of contaminants in the chamber due to reaction products can be reduced.

However, the purpose in this case is not to protect the wall surface but to catch contaminant particles. It is just described that the temperature for forming a surface coating layer on the inner wall surface of the chamber is lower than that of a workpiece (article to be processed) by more than 5° C. and the temperature range and control accuracy are not taken into account. The pressure range is a high pressure range such as several hundreds mtorr (several tens Pa). However, it is inferred that the deposition temperature of a film changes the composition and quality of the film and affects the film peeling strength and occurrence of foreign substances. It is expected that changing of the deposited film temperature results in occurrence of cracking and peeling due to repetition of thermal expansion and shrink and causes foreign substances and the temperature control accuracy is an important factor. Within a pressure range of several tens mtorr max. (several Pa max.), it is considered that the film deposition condition varies due to high ion energy and a longer mean free distance of molecules, Furthermore, in the aforementioned prior art, it is necessary to remove the coating layer catching contaminants from the wall surface of the plasma etching chamber and it directly affects the throughput of the equipment and the cost of expendable supplies. However, this respect is not taken into account.

SUMMARY OF THE INVENTION

The present invention is designed to eliminate the difficulties mentioned above and an object of the present invention is to provide a plasma etching apparatus maintaining the reproducibility and reliability of the process at a low cost for a long period of time so as to prevent the etching characteristic from a change with time by controlling the inner temperature of the reactor and deposition of reaction products.

The inventors have given diligent study to the aforementioned problems and as a result of it, found that when the inner wall surface temperature in the reactor is controlled to a temperature sufficiently lower than that of a wafer and a constant temperature within a pressure range of several Pa max. in the reactor, a strong coating film is formed on the inner wall surface. As a result of more detailed analysis, the inventors have acknowledged that this coating film is polymerized much more when the temperature at film forming time is lower, and when the temperature at film forming time is controlled constant, a solid layer structure is formed, accordingly the film surface is not peeled off and damaged and dust is not caused.

In the above description, that the inner wall surface temperature in the reactor is "sufficiently lower than that of a wafer and constant" means that the temperature is controlled with the accuracy of less than ±10° C. within a range lower than that of a wafer by 5° C. or more, desirably within a range lower by 20° C. or more. When the temperature of a wafer during processing is almost within a range from 100° C. to 110° C., it means that the temperature range is 100° C. or lower, desirably 80° C. or lower.

On the other hand, in the reactor, there is a part or a component part where the control in the aforementioned low temperature zone is difficult. The inventors have given study also to such a part and as a result of it, found a method for controlling the temperature and deposition of reaction products on the surface without using a complicated heating mechanism such as a heating resistor.

The present invention is designed on the basis of the aforementioned acknowledge and provides a plasma etching apparatus comprising a vacuum processing chamber, a plasma generation device, a processing gas supply means for supplying gas to the processing chamber, an electrode for holding a sample to be processed in this vacuum processing chamber, and an evacuation system for reducing the pressure of the vacuum processing chamber, which is characterized in that the processing gas includes at least one kind of gas having a composition for forming a polymerized film by plasma discharge, and the processing gas is made plasmatic by plasma discharge in the processing chamber, and at least one part of the inner wall surface (or the surface of an internal component part) in contact with plasma in the processing chamber is controlled to a constant temperature which is sufficiently lower than that of a sample, and a strong polymerized film is formed on the inner wall surface of the processing chamber.

Another characteristic of the present invention is that the temperature of the inner wall surface for forming the aforementioned polymerized film is controlled with the accuracy of less than ±10° C. within a range lower than that of the sample by 5° C. or more, desirably within a range lower by 20° C. or more.

Another characteristic of the present invention is that the processing pressure in the processing chamber is set within a range from 0.1 Pa to 10 Pa, desirably from 0.5 Pa to 4 Pa.

Another characteristic of the present invention is that the member constituting the inner wall surface of the processing chamber for forming the aforementioned polymerized film has a structure that it can be easily exchanged.

Another characteristic of the present invention is that the apparatus includes a process of controlling the growth of the aforementioned polymerized film formed on the inner wall surface of the processing chamber.

Still another characteristic of the present invention is that in the plasma etching apparatus comprising a vacuum processing chamber, a plasma generation device, a processing gas supply means for supplying gas to the processing chamber, an electrode for holding a sample to be processed in this vacuum processing chamber, and an evacuation system for reducing the pressure of the vacuum processing chamber, the component part (or the inner wall surface) in contact with plasma in the processing chamber is structured so that the bias power is applied to at least one part of the component part, and the heat capacity thereof is made sufficiently small, and the surface area thereof is made smaller.

Another characteristic of the present invention is that the temperature of the component part in contact with plasma in the processing chamber is adjusted within a range from 100° C. to 250° C., desirably from 150° C. to 200° C. and furthermore, the processing pressure is set within a range from 0.1 Pa to 10 Pa, desirably from 0.5 Pa to 4 Pa.

Another characteristic of the present invention is that the component part of the inner wall is ring-shaped and the surface area of the part in contact with plasma is 20% of the total area of the inner wall of the processing chamber or less.

Another characteristic of the present invention is that the component part in contact with plasma in the processing chamber, in which the bias power is applied to at least one part thereof is ring-shaped, and the thickness thereof is 6 mm or less, and the inner diameter thereof is more than the diameter of a sample Still another characteristic of the present invention is that the plasma etching apparatus is structured so that an infrared absorber is formed in the neighborhood of the side of the component part of the inner wall which is in contact with plasma and the temperature of the part is remotely controlled by the infrared radiation means.

Another characteristic of the present invention is that the temperature of the part whose temperature is controlled by the aforementioned infrared radiation is controlled with the accuracy of less than ±10° C. within a range from 100° C. to 250° C., desirably from 150° C. to 200° C.

Still another characteristic of the present invention is that in the plasma etching apparatus, the plasma generation apparatus is a magnetic field UHF band electromagnetic wave radiation and discharge system.

According to the present invention, a part of processing gas is polymerized by plasma discharge and a surface coating layer is formed by polymer on the part of the inner wall of the processing chamber which is in contact with plasma or the surface of the part. By controlling the temperature of the inner wall surface of the reactor to a constant temperature sufficiently lower than that of a wafer, the polymerization of the coating layer proceeds and a solid layer structure can be formed. Therefore, the inner wall surface will not be etched and consumed by plasma, so that the frequency of part exchange of the inner wall surface can be reduced and the running cost can be decreased. Even if the coating layer is exposed to plasma, peeling and damage are not caused to the surface thereof because the film composition is dense, so that dust will not be caused.

Since the temperature of the inner wall surface is set in a temperature zone lower than that of a wafer, as compared with a case that the temperature of the inner wall surface is set in a high temperature zone of 200° C. or more, the interaction between plasma and the inner wall surface is weak and not sensitive to a change in temperature. As a result, the reproducibility and reliability of the process hardly reduce for a long period of time and the accuracy of temperature control may be, for example, less than ±10° C. and can be realized comparatively easily without using a complicated mechanism for temperature control.

When a polymerized film exceeding a predetermined value is formed on the inner wall surface, it is necessary to remove this film. When the equipment is exposed to the air, and the component part of the inner wall surface of the processing chamber on which the polymerized film is formed is exchanged, and the equipment is reoperated, and the film is removed by wet cleaning on an ex-situ basis after removal from the chamber instead of plasma cleaning, and the inner wall surface is reproduced, satisfactory results can be produced such that the non-operation time of the equipment is reduced, and the throughput is prevented from reduction, and the cost of expendable supplies can be reduced by reproduction and repetitive use of parts. When a process of controlling the growth of the polymerized film is added to the process, the time up to opening and cleaning of the equipment can be prolonged.

On the other hand, according to still another characteristic of the present invention, with respect to a part or component part for which the temperature control in a temperature zone sufficiently lower than that of a wafer is difficult, when a structure that the bias power is applied to at least one part thereof is installed in the reactor and the heat capacity of the whole part is made sufficiently small, the whole part can be controlled in a high temperature zone without using a complicated mechanism such as a heater and lamp, so that excessive deposition of reaction products is controlled and an occurrence of foreign substances caused by peeling of reaction products can be reduced. When the surface area of the part is made smaller, the effect on the process can be controlled even if the temperature and surface condition are changed. Furthermore, when the magnitude of bias power to be applied to the component part is adjusted and the temperature is set within a range from 100° C. to 250° C., desirably from 150° C. to 200° C., as compared with a case that the temperature is set within a high temperature zone of about 250° C. or more, the process is not sensitive to a change in temperature, so that there is an advantage that the temperature change of the component part can be made smaller to a level that will not substantially affect the process.

According to still another characteristic of the present invention, the temperature of the component part in contact with plasma in the processing chamber can be controlled more actively with high accuracy in a high temperature zone using infrared radiation and gas heat transfer, so that excessive deposition of reaction products is controlled, and an occurrence of foreign substances caused by peeling of reaction products can be reduced, and the effect on the process also can be controlled by controlling changes in the temperature and surface condition. Furthermore, when the temperature is controlled with the accuracy of less than ±10° C. within a range from 100° C. to 250° C., desirably from 150° C. to 200° C., as compared with a case that the temperature is set within a high temperature zone of about 250° C. or more, the process is not sensitive to a change in temperature, so that there is an advantage that the temperature change of the component part can be made smaller to a level that will not substantially affect even a finer process.

DETAILED DESCRIPTION OF THE PREFERRED EMBODIMENTS

The embodiments of the present invention will be explained hereunder with reference to the accompanying drawings.

Figure 1:
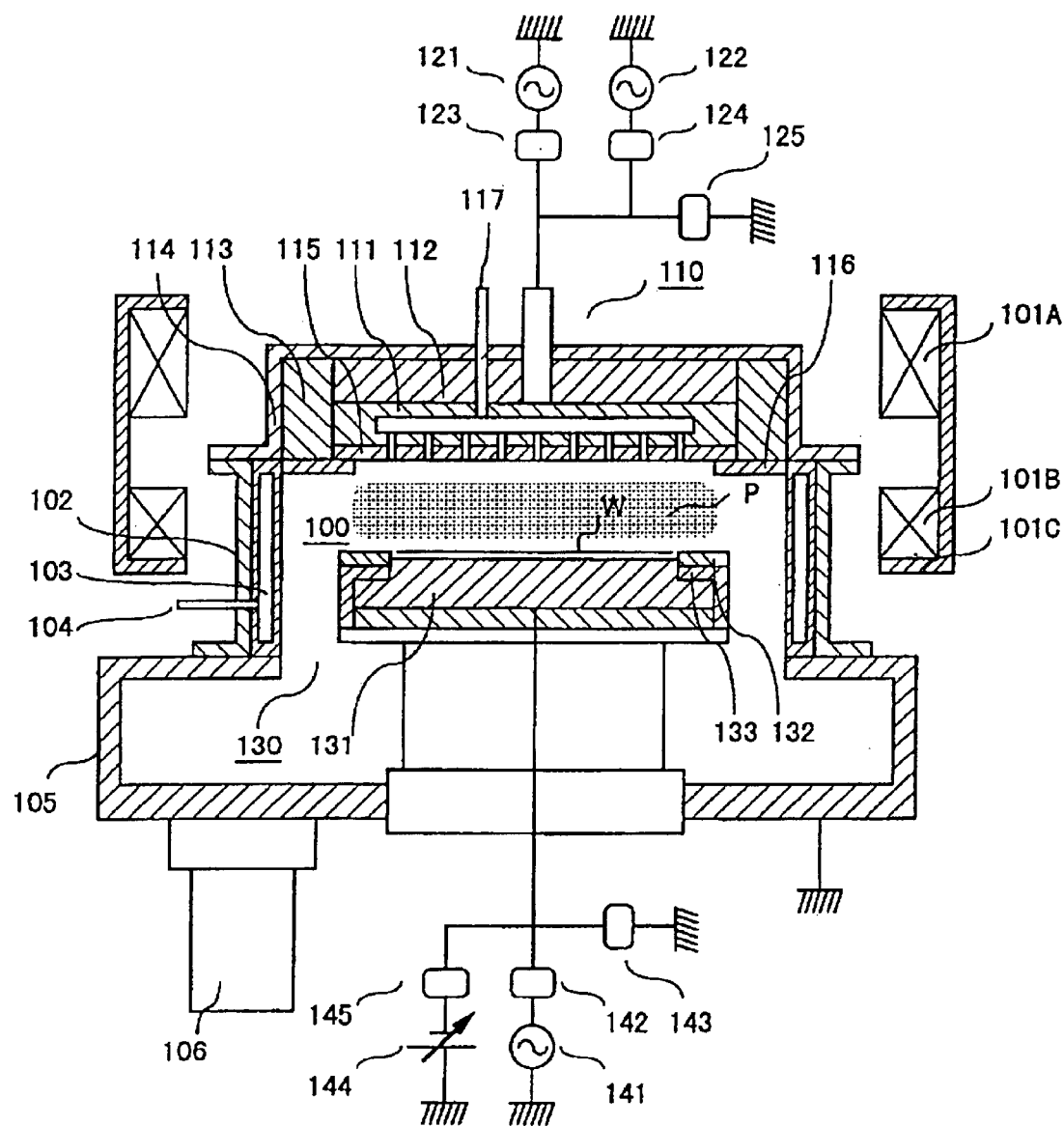
FIG. 1 is a cross sectional schematic diagram of a plasma etching apparatus which is an embodiment of the present invention.

FIG. 1 shows an embodiment that the present invention is applied to a plasma etching apparatus of a magnetic field UHF band electromagnetic wave radiation and discharge system and is a cross sectional schematic diagram of the said plasma etching apparatus.

In FIG. 1, a processing chamber 100 is a vacuum vessel which can realize the degree of vacuum of about $10^{-6}$ Torr and the apparatus has an antenna 110 for radiating electromagnetic waves as a plasma generation means in an upper part of the processing chamber and a lower electrode 130 for loading a sample W such as a wafer in a lower part of the processing chamber. The antenna 110 and the lower electrode 130 are installed opposite to each other in parallel. A magnetic field forming means 101 comprising electromagnetic coils 101A and 101B and a yoke 101C. is installed around the processing chamber 100 and a magnetic field having a predetermined distribution and intensity is formed. By the interaction of electromagnetic waves radiated from the antenna 110 and the magnetic field formed by the magnetic field forming means 101, processing gas introduced into the processing chamber is made plasmatic, and plasma P is generated, and the sample W is processed.

On a side wall or outer cylinder 102 of the processing chamber 100, a jacket or inner cylinder 103 for controlling the temperature of the inner surface of the side wall is held in the exchangeable state. A heat exchanging medium is circulated and supplied into the jacket 103 from a heat exchanging medium supply means 104 so as to control the temperature. The temperature of the jacket is controlled with the accuracy of less than ±10° C. within a range from 0° C. to 100° C., desirably from 20° C. to 80° C. On the other hand, the processing chamber 100 is evacuated by an evacuation system 106 connected to a vacuum chamber 105 and the inside of the processing chamber 100 is adjusted to a predetermined processing pressure within a range from 0.1 Pa to 10 Pa, desirably from 0.5 Pa to 4 Pa. The processing chamber 100 and the vacuum chamber 105 are set at the grounding potential. With respect to the side wall 102 of the processing chamber 100 and the jacket 103, the surface treatment such as plasma resistant anodized aluminum may be carried out on the surface thereof as a thermally conductive nonmagnetic metallic material including no heavy metal, for example, such as aluminum.

The antenna 110 radiating electromagnetic waves comprises a disc electricity conductor 111, a dielectric 112, and a dielectric ring 113 and is held by a housing 114 which is a part of the vacuum vessel. A plate 115 is installed on the surface of the side of the disc electricity conductor 111 which is in contact with plasma and a ring 116 is further installed on the periphery thereof. Processing gas for performing the processes of etching of samples and film deposition is supplied from a gas supply means 117 at a predetermined flow rate and mixture ratio, controlled to a predetermined distribution via many holes provided in the disc electricity conductor 111 and the plate 115, and supplied to the processing chamber 100.

An antenna power source 121 and an antenna high frequency power source 122 are connected to the disc electricity conductor 111 respectively via filter systems 123 and 124 of the matching circuit and connected to the ground via a filter 125. The antenna power source 121 supplies power at a UHF band frequency desirably within a range from 300 MHz to 900 MHz and electromagnetic waves in the UHF band are radiated from the antenna 110. On the other hand, the antenna high frequency power source 122 applies the bias power, for example, at a low frequency of about 100 kHz or a high frequency within a range from several MHz to about 10 MHZ to the disc electricity conductor 111, thus controls the reaction on the surface of the plate 115 in contact with the disc electricity conductor 111. Since the plate 115 is opposite to a wafer, it affects the process most greatly. However, since the bias power is applied to the surface so as to prevent reaction products from deposition, the equipment process is stabilized. Furthermore, for example, when high-purity silicone or carbon is used as a material of the plate 115 in oxide film etching using CF series gas, the F radical or CFx radical reaction on the surface of the plate 115 is controlled and the radical composition ratio is adjusted. The distance between the under surface of the plate 115 and the wafer W (hereinafter, it is called the gap) is within a range from 30 mm to 150 mm, desirably from 50 mm to 120 mm.

The disc electricity conductor 111 is kept at a predetermined temperature by a temperature control means not shown in the drawing, that is, by a heat exchanging medium circulating through it and the surface temperature of the plate 115 in contact with the disc electricity conductor 111 is controlled. The ring 116 is heated by the bias power from the antenna high frequency power source 122 and the temperature thereof is controlled. It will be described later in detail.

At the lower part of the processing chamber 100, the lower electrode 130 is installed opposite to the antenna 110 A bias power source 141 for supplying bias power within a range from 400 kHz to 13.56 MHz is connected to the lower electrode 130 via a filter system 142 of the matching circuit, controls the bias power to be supplied to the sample W, and is connected to the ground via a filter 143.

The lower electrode 130 loads and holds the sample W such as a wafer on the top thereof, that is, on the sample loading surface by an electrostatic chucking device 131. On the top of the electrostatic chucking device 131, an electrostatic chucking dielectric layer (hereinafter, abbreviated to an electrostatic chucking film) is formed. The electrostatic chucking device 131 applies a DC voltage within a range from several hundreds V to several kv by an electrostatic chucking DC power source 144 and a filter 145 so as to generate coulomb force acting between the sample W and the electrostatic chucking device 131 via the electrostatic chucking film and adsorbs and holds the sample W on the lower electrode 130. As an electrostatic chucking film, for example, an dielectric of aluminum oxide or of a mixture of aluminum oxide and titanium oxide is used.

Furthermore, the sample W is controlled by a temperature control means not shown in the drawing so that the surface temperature thereof is set to a predetermined temperature so as to control the surface reaction thereof. For that purpose, to the lower electrode 130 an inert gas, for example, He gas which is set at a predetermined flow rate and pressure is supplied to enhance the thermal conductivity between the electrostatic chucking device 131 and the sample W. By doing this, the temperature of a wafer is controlled within a range from 100° C. to 110° C. at its maximum.

A sample holder ring 132 is installed outside the sample W on the top of the electrostatic chucking device 131. As a material of the sample holder ring 132 ceramics such as SiC, carbon, silicone, or quartz is used. The sample holder ring 132 is insulated from the electrostatic chucking device 131 by an insulator 133 such as alumina. Furthermore, by leaking and adding a part of the bias power from the bias power source 141 to the sample holder ring 132 via the insulator 133, it is possible to adjust the application of the bias power to the sample holder ring 132 and control the reaction on the surface thereof. For example, when high-purity silicone is used as a material of the sample holder ring 132 in oxide film etching using CF series gas, the F radical or CFx radical reaction on the surface of the sample holder ring 132 is adjusted by the scavenging action of silicone and particularly the uniformity of etching on the periphery of a wafer can be improved. The sample holder ring 132 is heated by the bias power and cooled by heat transfer gas, thus the temperature thereof is controlled. It will be described later in detail.

The plasma etching apparatus in this embodiment is structured as mentioned above and a concrete process, for example, when a silicon oxide film is to be etched using this plasma etching apparatus will be explained hereunder by referring to FIG. 1.

Firstly, the wafer W which is an object to be processed is transferred from a sample transfer mechanism not shown in the drawing into the processing chamber and loaded and chucked on the lower electrode 130. The height of the lower electrode is adjusted as required so as to be set to a predetermined gap. Next, the inside of the processing chamber 100 is evacuated by the evacuation system 106. On the other hand, gases necessary to the etching process of the sample W, for example, C4F8 and Ar are supplied to the processing chamber 100 from the plate 115 of the antenna 110 by the gas supply means 117 at a predetermined flow rate and mixture ratio, for example, at an Ar flow rate of 300 sccm and a C4F8 flow rate of 9 sccm. At the same time, the processing chamber 100 is evacuated by the evacuation system 106 and the inside of the processing chamber 100 is adjusted to a predetermined processing pressure, for example, 1 Pa. On the other hand, a magnetic field of a predetermined distribution and intensity is formed by the magnetic field forming means 101. Electromagnetic waves in the UHF band are radiated from the antenna 110 by the antenna power source 121 and plasma P is generated in the processing chamber 100 by the interaction with the magnetic field. The apparatus dissociates processing gas by this plasma P so as to generate radical ions and further performs the process such as etching to the wafer W by controlling the antenna high frequency power source 122 and the bias power source 141. When the etching process is finished, the apparatus stops the supply of the power and processing gas and terminates the etching.

The plasma etching apparatus in this embodiment is structured as mentioned above and each unit in the reactor, particularly the inner surface of the side wall 103 and the ring 116, and temperature control of the sample holder ring 132 and deposition control of reaction products will be explained in detail hereunder.

Firstly, the side wall 103 will be explained by referring to FIG. 1. As already explained, the jacket 103 is held inside the side wall 102 of the processing chamber 100 and the temperature can be controlled by a heat exchanging medium.

The inventors have experimented with an object of oxide film etching at a pressure of 2 Pa using a mixed gas series of C4F8 and Ar as a processing gas and as a result of it, we have found that when the inner wall surface temperature in the reactor is controlled to a constant temperature which is sufficiently lower than the temperature (about 100° C.) of a wafer with the accuracy of less than ±10° C. within a range from 25° C. to 80° C., a strong coating film is formed on the inner wall surface. Within a pressure range of several tens mtorr max. (several Pa max.) like this, ions of high energy increase, so that it can be considered that the ion assist effect in film deposition is increased and a tight film is formed. The condition of a deposited film is such that when the side wall temperature is low, a fine and strong film is formed and when the side wall temperature is high, a slightly rough film is formed. To make this change of film characteristic quantitatively clear, the composition (element density ratio) of a film deposited at a side wall temperature of each of 25° C., 50° C., and 80° C. has been analyzed by the XPS (X-ray photoelectron spectroscopy) and the following results have been obtained.

| Side wall temperature | C (%) | F (96) | CF ratio |
|---|---|---|---|
| 25° C. | 45.6 | 51.1 | 0.89 |
| 50° C. | 43.9 | 53.8 | 0.82 |
| 80° C. | 40.6 | 58.2 | 0.70 |

The results show that as the side wall temperature lowers, the film characteristic becomes richer with carbon. Although not shown above, the analysis of the C1s peak shows that as the side wall temperature lowers, the bonding of carbon proceeds and the polymerization also proceeds. It is inferred that this is macroscopically observed as a fine and strong film.

During this experiment, the temperature of the side wall surface is controlled with the accuracy of less than ±10° C., so that it is forecasted that internal stress caused by a temperature change is not generated during deposition of a film and the film structure becomes fine. It is confirmed that a solid layer structure is formed. This film is very fine and strong and even when a film is deposited tentatively up to a thickness of about 200 microns in the deposition acceleration test, peeling of the film in the tape peeling test or in the friction test are not observed. Furthermore, this film is highly resistant to plasma and it is acknowledged that peeling and damage of the film surface are not observed even by the processing of plasma and no dust is caused.

When the temperature of the inner wall surface of the reactor is controlled to a constant temperature which is sufficiently lower than the temperature of a wafer as mentioned above, a strong deposited film free of occurrence of internal thermal stress can be formed on the inner wall surface of the reactor. This film is highly resistant to plasma and peeling of reaction products and adhesion of particles onto the sample surface are reduced, so that it acts as a protection film for the inner wall of the reactor. Therefore, the side wall is free of consumption and damage, so that the exchange frequency of parts of the side wall can be reduced and the reduction of running cost results. Furthermore, since the side wall is protected by the deposited film, there is no need to use ceramics such as SiC which is highly resistant to plasma and the cost of parts can be reduced. If the side wall temperature is particularly controlled within a range from normal temperature to about 50° C., the energy for heating the side wall can be reduced, so that it is effective in energy conservation. As a material of the side wall, a thermally conductive metal including no heavy metals, for example, aluminum may be used.

Since aluminum is exposed in the initial state free of a deposited film, there is the possibility that the surface will be damaged and deteriorated by plasma. To prevent it, the surface may be coated with a highly polymerized material. Or it is also possible, for example, to anodize the aluminum surface and then fill fine holes made by the anodizing process with a highly polymerized material. Needless to say, the hole filling process can be applied to other than the aluminum anodizing process. When a polymer film exists on the interface between the aluminum surface and the deposited film like this, an effect is produced that the adherence of the aluminum surface and the deposited film is increased and the deposited film is hardly peeled off. A film may be excessively deposited depending on the process. If this occurs, it is possible to execute plasma cleaning in a short time after the wafer processing so as to control film deposition and keep the film thickness constant.

Next, the sample holder ring will be explained. As already explained in the embodiment shown in FIG. 1, the sample holder ring 132 controls the reaction on the surface thereof by application of the bias power, thus can make the etching characteristic particularly on the periphery of a wafer uniform. Although the sample holder ring 132 is heated by the bias power in this case, it is necessary to control the applied bias power and temperature so as to control the reaction and deposition of a film on the surface thereof. Moreover, it is desirable to be capable of controlling the applied bias power and temperature without incorporating a complicated mechanism into the lower electrode incorporated in the electrostatic chucking device 131. This can be realized by control of the leakage bias power and the balance between heating by the bias power and cooling by heat transfer gas. This embodiment will be explained by referring to the cross sectional view (half on the right) of the lower electrode 130 shown in FIG. 2.

The lower electrode 130 holds the sample W by the electrostatic chucking device 131. The electrostatic chucking device 131 is insulated from the ground 135 by the insulator 134. In this embodiment, the sample holder ring 132 is installed opposite to the electrostatic chucking device 131 via the insulator 133, thus structured so that a part of the bias power supplied from the bias power source 141 is leaked and added. The bias power to be applied can be adjusted by the thickness and material of the insulator 133. By use of such a bias power application structure, there is no need to install a wiring structure to the sample holder ring 132 inside the lower electrode 130 and connect another bias power source to the sample holder ring 132.

The electrostatic chucking device 131 is kept at a predetermined temperature by circulation of a temperature control heat medium (not shown in the drawing). Between the sample W and the surface of the electrostatic chucking device 131, a flow path 136 of heat transfer gas (for example, He gas, etc.) is formed and the heat conduction is kept satisfactory by introduction of heat transfer gas. In this embodiment, flow 136A and 136B of heat transfer gas are also formed between the sample holder ring 132 the insulator 133 and the electrostatic chucking device 131. A part of heat transfer gas for wafer cooling is introduced and the heat conduction at the contact is kept satisfactory. As a result, the heat conduction between the sample holder ring 132 and the electrostatic chucking device 131 kept at a predetermined temperature is kept satisfactory and the temperature of the sample holder ring 132 is kept stable. As a result, the temperature change due to application of the bias power to the sample holder ring 132 is controlled and the surface reaction and sample processing characteristic in the sample holder ring 132 can be stabilized. At the same time, deposition of reaction products can be prevented by heating by the bias power and ion assist, so that peeling of reaction products and adhesion of particles onto the sample surface are reduced.

As mentioned above, in the sample holder ring, the surface reaction and temperature and deposition of a film can be controlled by a simple structure by application of the leakage bias power and the balance between heating by the bias power and cooling by heat transfer gas and long term stabilization of the process and reduction of foreign substances can be realized.

In this embodiment, the heat conduction is assured by heat transfer gas. However, another heat conduction means, for example, such as a thermally conductive sheet may be used.

Next, the antenna 110 will be explained. As already described in the embodiment shown in FIG. 1, the antenna high frequency power source 122 is connected to the disc electricity conductor 111 and the bias power at about 100 kHz or within a range from several MHz to about 10 MHz is applied. The temperature of the disc electricity conductor 111 is kept at a predetermined value by a heat exchanging medium. Therefore, the plate 115 in contact with the disc electricity conductor 111 is applied with the bias power and the surface temperature thereof is also controlled. Since the plate 115 is opposite to a wafer, it affects the process most greatly. However, when the bias power is applied to this surface so as to prevent reaction products from deposition and further the surface reaction by the scavenging action is used using high-purity silicone as a material of the plate, the process can be stabilized.

On the other hand, the ring 116 on the periphery of the plate 115 is heated by the bias power by the antenna high frequency power source 122 in the same way as with the plate 115 and moreover the heat capacity of the ring 116 is made smaller, thus the responsibility to temperature change is enhanced. This will be explained by referring to FIG. 3.

Figure 3:
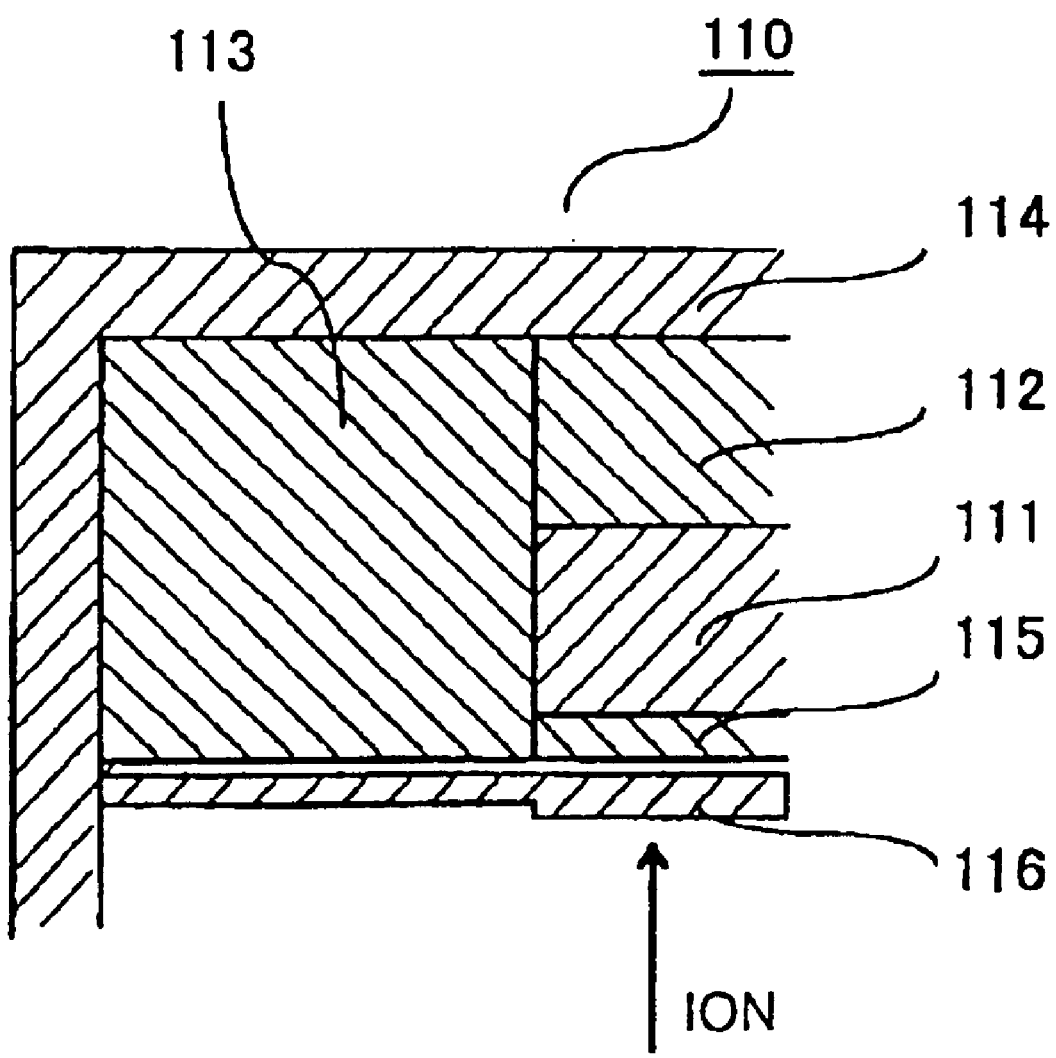
FIG. 3 is a drawing showing the temperature control method of a ring which is an embodiment of the present invention.

FIG. 3 shows an embodiment showing the temperature control method for the ring 116. In this embodiment, the ring 116 is structured so that the shape thereof is made thinner, and a part thereof covers the plate 115, and the thermal contact with the dielectric ring 113 and the plate 115 is minimized. When the antenna high frequency power is applied to the plate 115 in this case, ions are pulled into the surface of the ring 116 in the direction of the arrow shown in the drawing by the bias power to the plate 115. A heating mechanism such a heater and lamp is not used in this embodiment, so that there is an advantage that the mechanism will not be complicated.

The width w of the part of the ring 116 to which the bias power is applied is set to, for example, 10 mm or more so that the part can be efficiently heated by the bias power. The thickness of the ring 116 is set to, for example, 6 mm or less, desirably 4 mm or less so as to be validly heated by the bias power. When the shape is made thinner like this, the heat capacity of the ring 115 is made smaller. As a result, the whole ring can be heated almost within a range from 100° C. to 250° C., desirably from 150° C. to 200° C. As a result, the deposition of reaction products is controlled and the occurrence of foreign substances due to peeling of reaction products can be reduced. Within this temperature range, the change in surface reaction is not sensitive to the change in temperature compared with that in a high temperature zone of about 250° C. or more, so that there is an advantage that the temperature change in component parts can be made smaller to such a level that will not substantially affect the process.

The thickness of the ring 116 can be decided by the antenna bias power frequency, the material of the ring 116, and the balance of the deposition speed of reaction products to the ring 116 so as to control the film deposition and prevent the ring surface from sputtering and consuming by ions. As shown in the drawing, it is possible to make the parts other than the part to be applied with the bias power thinner and make the heat capacity of the whole ring smaller. When the heat capacity of the ring 116 is made smaller like this, the responsibility is satisfactory in a short time at the initial stage of the process and the temperature rises, so that the effect on the processing characteristic is small. It is desirable that the inner diameter d of the ring 116 is larger than the diameter of a sample. Since the inner diameter of the reactor is about 1.5 times of the diameter of a sample, when the diameter of a sample is 300 mm, the width s of the ring is almost within a range from 50 mm to 70 mm and the surface area thereof is sufficiently small for the whole inner wall surface of the reactor, for example, such as 20% or less. When the surface area of parts is made smaller like this, even if the temperature and surface condition are changed, the effect on the process can be controlled. Moreover, since the ring 116 is positioned on the periphery compared with a wafer, the effect on the process is made more smaller.

Figure 4:
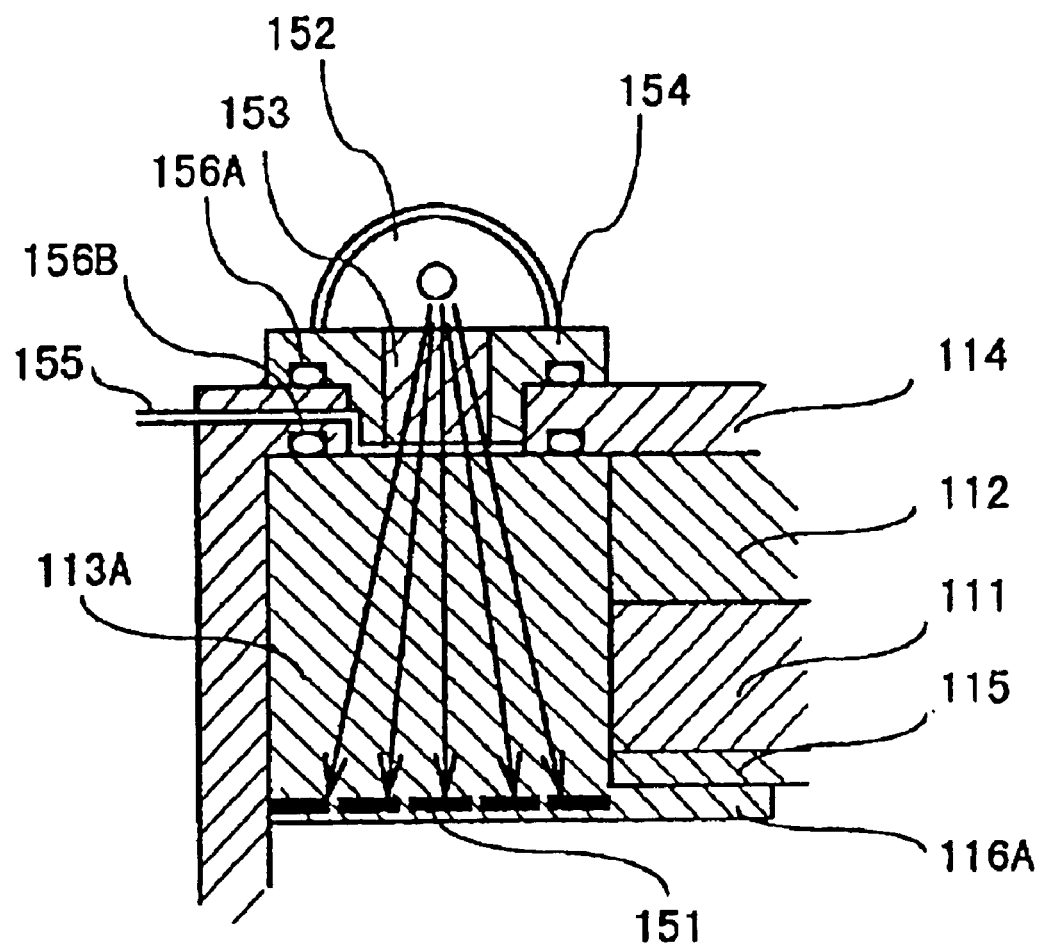
FIG. 4 is a drawing showing the temperature control method of a ring by an infrared lamp which is an embodiment of the present invention.

In the aforementioned embodiment, since passive heating by plasma is used, a certain degree of temperature change is unavoidable. This change may affect the etching characteristic due to fine division of the process though the effect is not actualized in the current process and if this occurs, a positive temperature control mechanism by a lamp and heater is required. FIG. 4 shows an embodiment of a temperature control mechanism by heating of a lamp.

In this embodiment, the dielectric ring 113A is structured so that a part thereof can apply the bias power by the same structure 116A as that of the ring 116 and furthermore, on the side of the dielectric ring 113A close to plasma, an infrared absorber 151 for absorbing infrared light and far infrared light, for example, an aluminum thin film is formed. Infrared light and far infrared light are radiated from an infrared radiation means 152, pass through an infrared transmission window 153 and the dielectric ring 113A, are absorbed by the infrared absorber 151, and heat the ring 116. The infrared absorber 151 can be remotely heated by infrared light, so that when the infrared absorber 151 is installed on the side of the dielectric ring 113A close to plasma, the temperature of the surface of the dielectric ring 113A exposed to plasma can be controlled with higher accuracy. The heating mechanism uses absorption of infrared light, so that there is an advantage that the responsibility is better compared with heating by a heating resistor. Furthermore, the dielectric ring 113A is heated also by the bias power by the bias power application unit 116A, so that the responsibility to temperature is improved.

On the other hand, the infrared radiation means 152 is installed in a holder 154. A gap is provided between the holder 154 and the dielectric ring 113A and heat transfer gas for temperature control is supplied to the gap via a gas supply means 155. Heat transfer gas is sealed by vacuum sealing means 156A and 156B. The dielectric ring 113A radiates heat by this gas heat transfer via the holder 154. Therefore, for example, by heating by the bias power and lamp at start of the process and radiating heat by gas heat transfer during the process, the accuracy of temperature control is improved. As a result, the temperature of the dielectric ring 113A can be controlled with the accuracy of about ±5 to 10° C. almost within a range from 100° C. to 250° C., desirably from 150° C. to 200° C. The film deposition is reduced at this temperature, so that the occurrence of foreign substances due to peeling of a film is controlled. The surface condition of the dielectric ring 113A is in the region greatly dependent on the temperature, so that the surface condition is not changed and a plasma process which is stable over a long period is realized.

Figure 5:
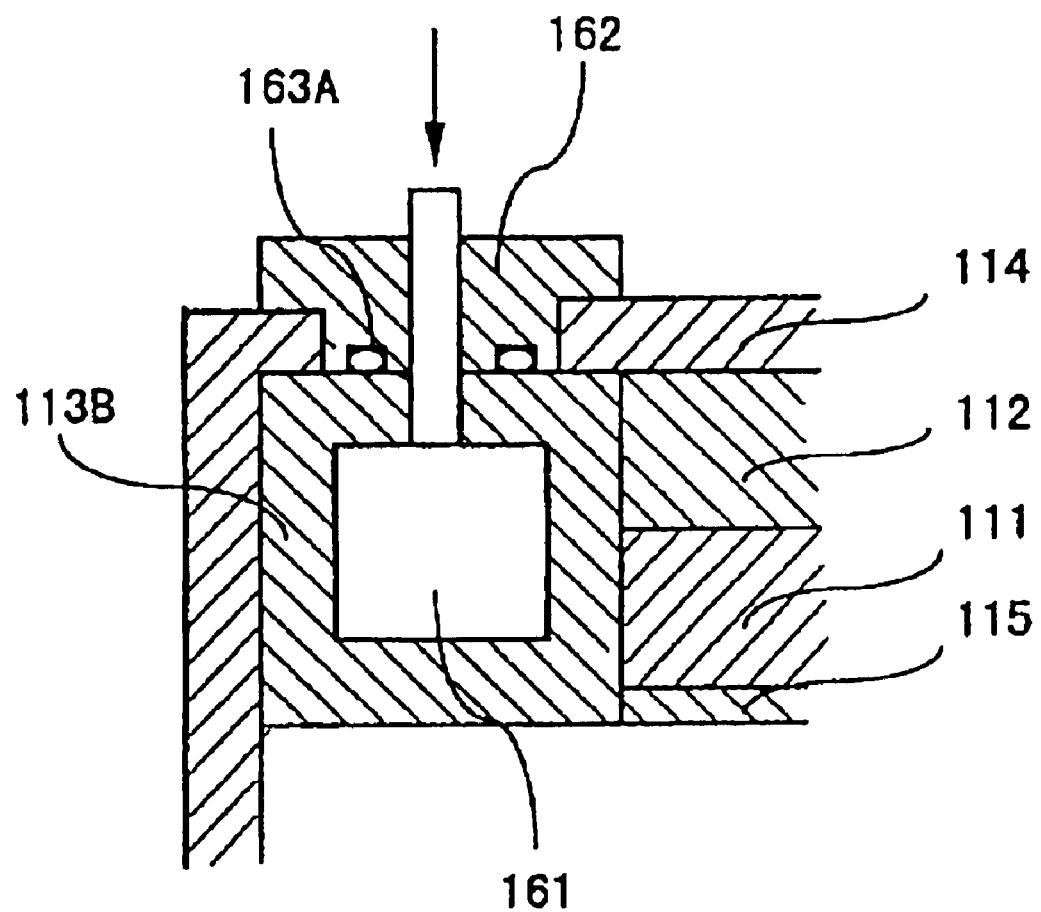
FIG. 5 is a drawing showing the temperature control method of a ring by a refrigerant which is an embodiment of the present invention.

In the embodiments shown in FIGS. 3 and 4, the film deposition is reduced by heating the ring 116 in contact with plasma and the dielectric ring 113A. However, the ring in contact with plasma is controlled to a constant temperature which is lower than the temperature of a wafer in the same way as with the inner surface of the side wall explained in FIG. 1 and a stable deposited film can be formed. FIG. 5 shows this embodiment and the dielectric ring 113B is controlled almost within a range from 20° C. to 100° C. under temperature control by a refrigerant.

In this embodiment, a refrigerant for temperature control is supplied to a refrigerant flow path 161 installed in the dielectric ring 113B from a heat exchanging medium supply means 162. The refrigerant is sealed by a sealing means 163. The temperature of the dielectric ring 113B is kept at a predetermined value by a temperature controller and temperature detector which are not shown in the drawing. By use of this constitution, the temperature of the dielectric ring 113B can be kept almost within a range from 200° C. to 100° C. during plasma processing. Therefore, a stable and strong film of reaction products is deposited on the surface of the dielectric ring 113B, so that the surface of the dielectric ring 113B will not be etched and consumed. When a film is excessively deposited depending on the process, the film may be kept at a constant thickness by concurrently using plasma cleaning.

Each of the aforementioned embodiments uses a plasma etching apparatus of a magnetic field UHF band electromagnetic wave radiation and discharge system. However, electromagnetic waves to be radiated may be, for example, microwaves at 2.45 GHz or waves in the VHF band almost within a range from several tens MHz to 300 MHz in addition to the UHF band. The magnetic field is not always necessary and, discharge of nonmagnetic field microwaves, for example, is acceptable.

Furthermore, in addition to the above, the aforementioned embodiments can be applied to, for example, a magnetron type plasma etching apparatus using the magnetic field, a plasma etching apparatus of a parallel plate type capacitively coupled system, or an inductive coupling type plasma etching apparatus.

Figure 6:
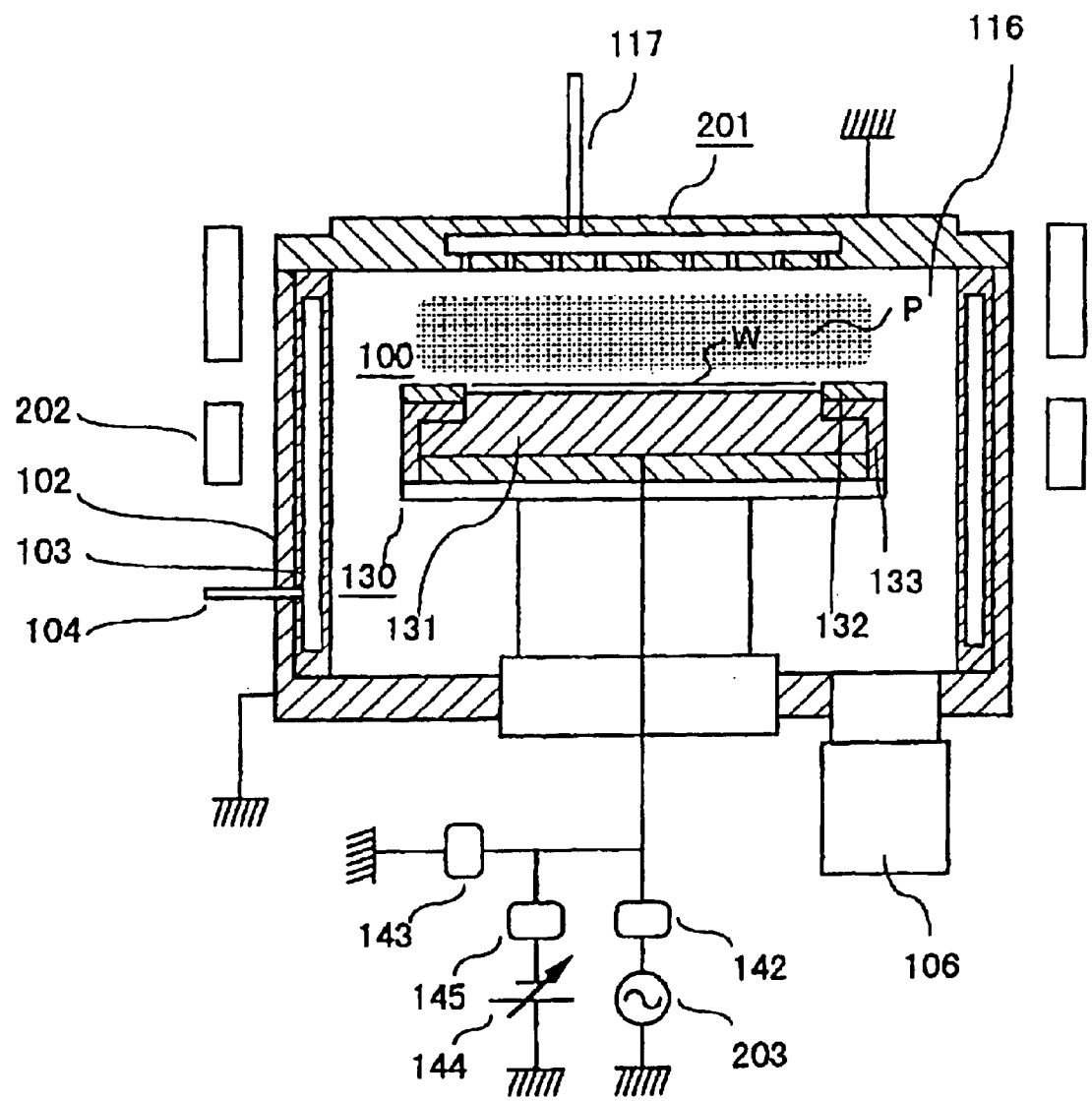
FIG. 6 is a cross sectional schematic diagram of a magnetic field RIE plasma etching apparatus which is an embodiment of the present invention.

FIG. 6 shows an example that the present invention is applied to an RIE apparatus (a magnetron RIE apparatus or magnetically enhanced RIE apparatus). The processing chamber 100 as a vacuum vessel has the side wall 102, the lower electrode 130 for loading the sample W such as a wafer, and an upper electrode 201 to be grounded opposite to it and also has the gas supply means 117 for introducing predetermined gas into the vacuum vessel, the evacuation system 106 for decompressing and evacuating the vacuum vessel, an electric field generation means 203 for generating an electric field between the lower electrode and the upper electrode, and a magnetic field generation means 202 for generating a magnetic field inside the vacuum vessel. The magnetic field generation means 202 has a plurality of permanent magnets or coils which are arranged in a ring-shape on the periphery of the processing chamber 100 and forms a magnetic field almost parallel to the electrodes inside the processing chamber. The magnetic field generation means 202 makes processing gas plasmatic by the electric field generated between the electrodes, generates plasma P, and processes the sample W. Furthermore, in the magnetron RIE, a magnetic field is formed almost perpendicularly to the electric field by the magnetic field generation means 202, so that the collision frequency between electrons and molecules and atoms in plasma increases, and the plasma density increases, and a high etching characteristic is obtained.

In this embodiment, in the same way as with the embodiment described in FIG. 1, the jacket 103 for controlling the temperature of the inner surface of the side wall is held by the side wall 102 in the exchangeable state, and a heat exchanging medium is circulated and supplied into the jacket 103 from the heat exchanging medium supply means 104, and the temperature of the jacket is controlled with the accuracy of less than ±10° C. within a range from 0° C. to about 100° C., desirably 20° C. to about 80° C. The jacket 103 comprises, for example, anodized aluminum.

By use of this constitution, the inner wall surface of the reactor can be controlled to a constant temperature which is sufficiently lower than the temperature of a wafer, so that a strong deposited film can be formed on the inner surface of the side wall of the reactor. This film is highly resistant to plasma and acts as a protection film for the inner wall of the reactor and peeling of reaction products and adhesion of particles onto the sample surface are reduced. Therefore, the side wall is free of consumption and damage, so that the exchange frequency of parts of the side wall can be reduced, and the reduction of running cost results, and there is no need to use ceramics such as SiC which is highly resistant to plasma, and the cost of parts can be reduced.

Figure 2:
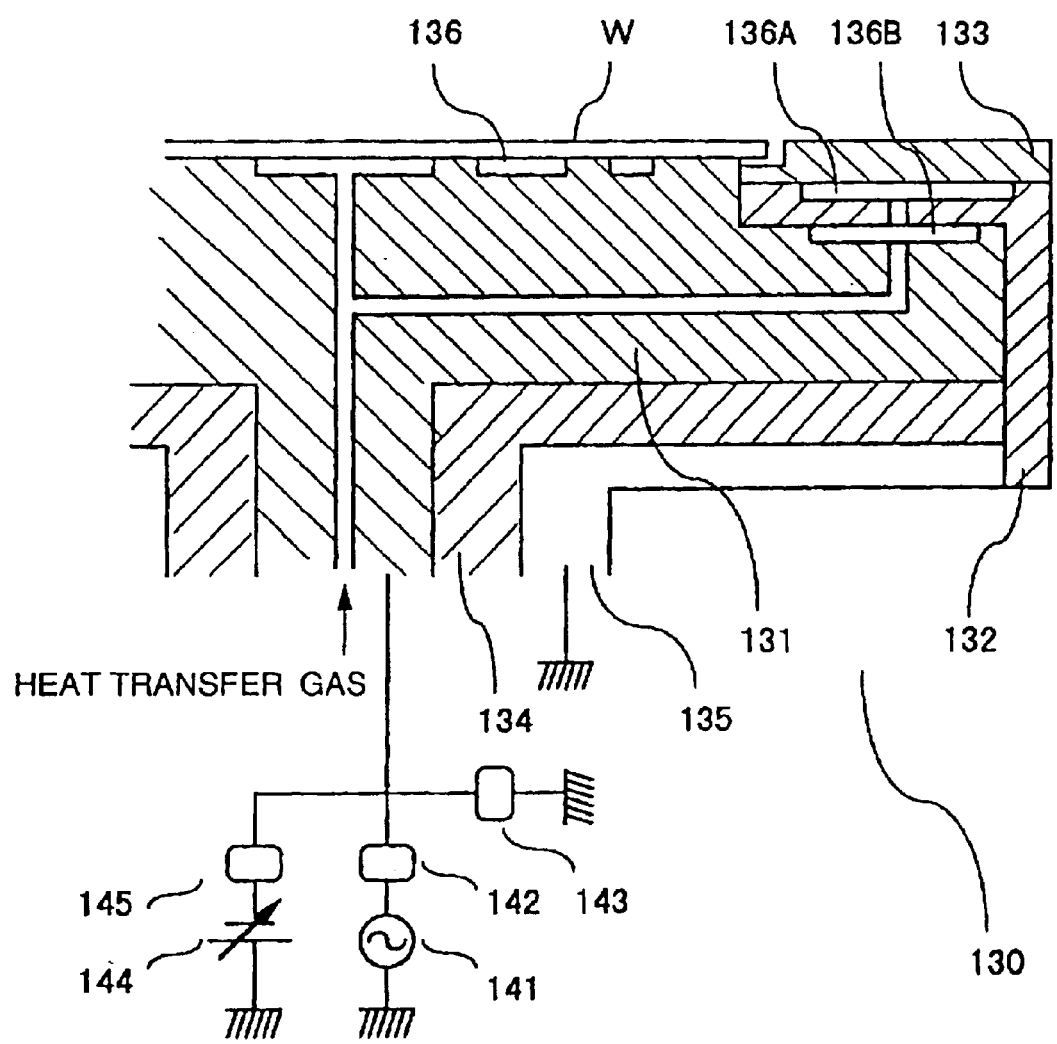
FIG. 2 is a drawing showing the temperature control method of a sample holder ring which is an embodiment of the present invention.

In this embodiment, in the same way as with the embodiment described in FIGS. 1 and 2, it is structured so that a part of the bias power supplied from the electric field generation means 203 is leaked to the sample holder ring 132 and furthermore, by cooling by gas heat transfer, the surface reaction and sample processing characteristic in the sample holder ring 132 can be stabilized. At the same time, deposition of reaction products can be prevented by heating by the bias power and ion assist, so that peeling of reaction products and adhesion of particles onto the sample surface are reduced.

Figure 7:
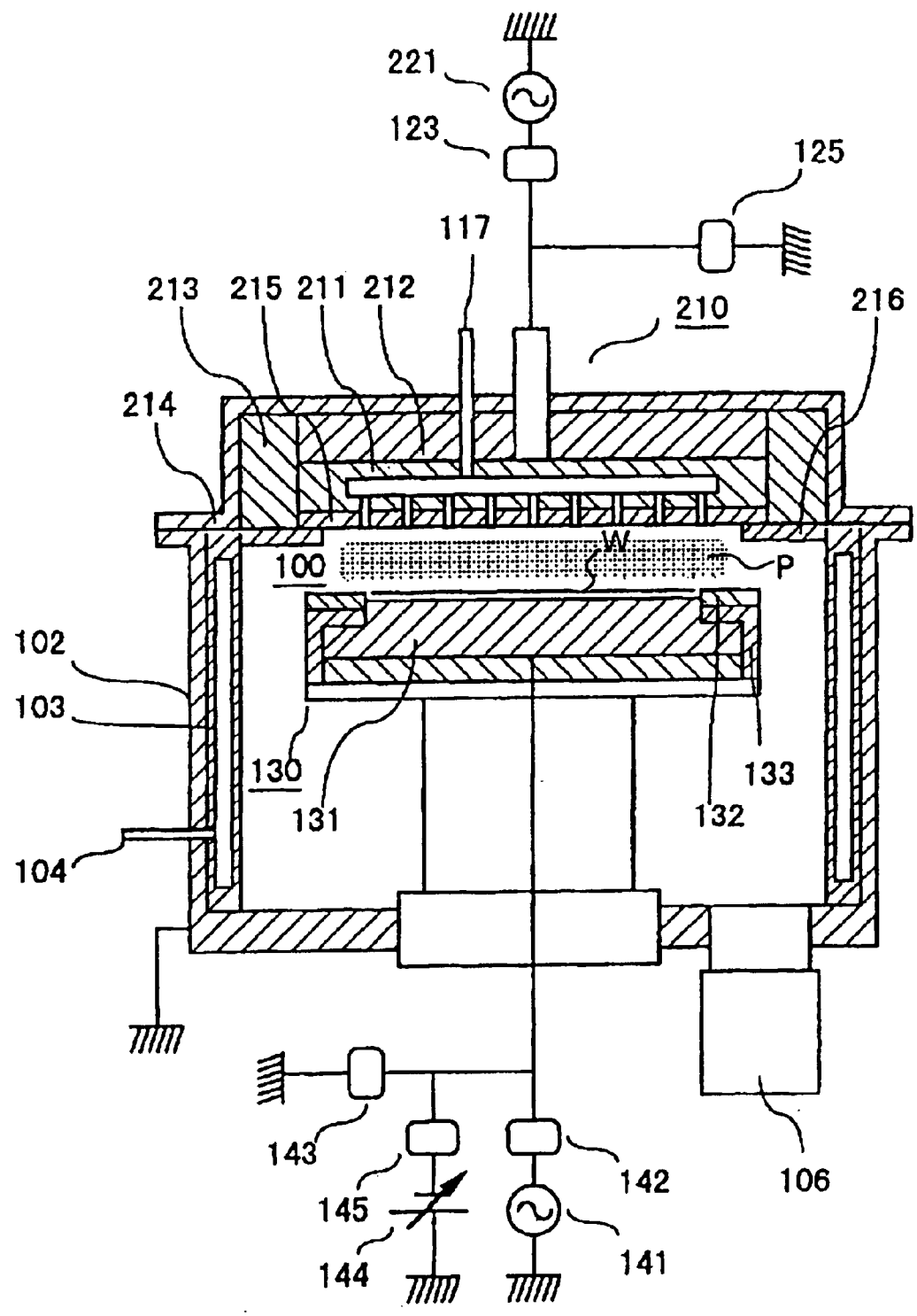
FIG. 7 is a cross sectional schematic diagram of a parallel plate type plasma etching apparatus which is an embodiment of the present invention.

FIG. 7 shows an example that the present invention is applied to a parallel plate type plasma etching apparatus. The processing chamber 100 as a vacuum vessel has the side wall 102, the lower electrode 130 for loading the sample w such as a wafer, an upper electrode 210 opposite to it, and an electric field generation means 221 for supplying power to the upper electrode 210 and generating an electric field between the electrodes. Predetermined processing gas is supplied into the processing chamber 100 by the gas supply means 117 and the vacuum vessel is decompressed and evacuated by the vacuum system 106. Processing gas is made plasmatic by the electric field generated between the electrodes, and plasma P is generated, and the sample W is processed. The upper electrode 210 is held by a housing 214 with an electrode plate 211 insulated by insulators 212 and 213. A plate 215 is installed on the side of the electrode plate 211 in contact with plasma and a shield ring 216 is installed on the periphery thereof. The shield ring 216 protects the insulators 212 and 213 from plasma, simultaneously increases the plasma density by sealing the plasma P in the processing chamber 100 in the state that it is positioned opposite to the sample holder ring 132 and obtains a high etching characteristic.

In this embodiment, in the same way as with the embodiment described in FIG. 1, the temperature of the inner surface of the side wall 102 is controlled by the jacket 103 with the accuracy of less than ±10° C. within a range from 0° C. to about 100° C., desirably 20° C. to about 80° C., so that a deposited film resistant to plasma is formed and acts as a protection film for the inner wall of the reactor, and particles can be reduced, and the exchange frequency of parts of the side wall can be reduced. Also with respect to the sample holder ring 132 the surface reaction and sample processing characteristic can be stabilized by the leakage bias power application structure and gas cooling, and the deposition of reaction products is prevented, and the occurrence of particles is reduced. Furthermore, in the same way as with the embodiment shown in FIG. 3, the shield ring 216 is structured so that the shape thereof is thin, and a part of the shield ring 216 covers the plate 115, and the thermal contact with other parts is minimized. As a result, when power is applied to the plate 115, the shield ring 216 is heated by ions due to the self bias power, and the deposition of reaction products is controlled, and the occurrence of foreign substances is reduced.

Figure 8:
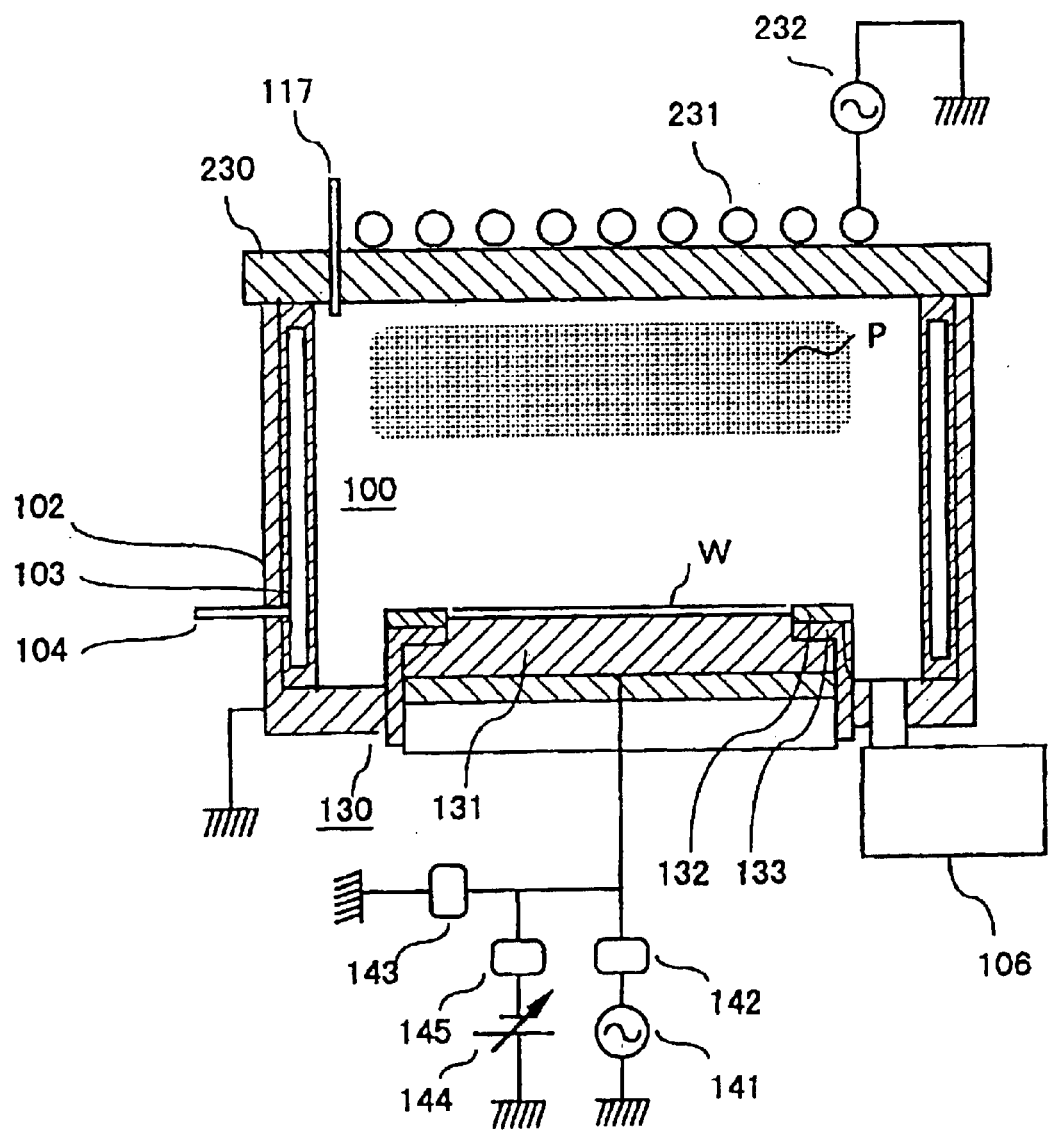
FIG. 8 is a cross sectional schematic diagram of an inductive coupling type plasma etching apparatus which is an embodiment of the present invention.

FIG. 8 shows an example that the present invention is applied to an inductively coupled type plasma etching apparatus. The processing chamber 100 as a vacuum vessel has the side wall 102, the lower electrode 130 for loading the sample W such as a wafer, and a top plate 230 and is decompressed and evacuated by the vacuum system 106. On the top of the top plate 230, inductive discharge coils 231 are arranged and high frequency power is supplied from a high frequency power source 232. Processing gas is supplied from the gas supply means 117 and made plasmatic by inductive discharge by the inductive discharge coils 231, and plasma P is generated, and the sample W is processed. In the inductive coupling type plasma etching apparatus, silicone is used as a material of the top elate so as to stabilize the process and the interaction between plasma and the wall is controlled by a means, for example, a Faraday shield or a magnetic field, thus even if the temperature of the side wall is made lower than the temperature of a wafer, a high etching characteristic can be obtained stably.

In this embodiment, in the same way as with the embodiment described in FIG. 1, the temperature of the inner surface of the side wall 102 is controlled by the jacket 103 with the accuracy of less than ±10° C. within a range from 0° C. to about 100° C., desirably 20° C. to about 80° C. As a result, a deposited film resistant to plasma is formed and acts as a protection film for the inner wall of the reactor, and particles can be reduced, and the exchange frequency of parts of the side wall can be reduced. Also with respect to the sample holder ring 132 the surface reaction and sample processing characteristic can be stabilized by the leakage bias power application structure and gas cooling, and the deposition of reaction products is prevented, and the occurrence of particles is reduced.

In the aforementioned embodiments, the processing object is semiconductor wafers and the etching process for them is described. However, the present invention is not limited to it and for example, it can be applied also to a case that the processing object is a liquid crystal board and the process itself is not limited to etching but the present invention can be applied also to, for example, the sputtering or CVD process.

In the aforedescribed embodiments, the temperature of the inner cylinder or jacket may be detected indirectly, if it cannot be detected directly. However, the following effects can be obtained by attaching a temperature detector to the inner cylinder or jacket.

(1) By finely adjusting the temperature of the outer cylinder or side wall in order to control the temperature of the Inner cylinder or jacket more accurately, controllability of the inner cylinder or jacket temperature can be improved.

(2) By monitoring the temperature of the inner cylinder or jacket, it is possible to output an alarm signal, such as to indicate the need for stopping plasma processing or to quit plasma processing when the temperature of the inner cylinder or jacket exceeds a preset range.

In the embodiments, a heater may be used as the temperature control function for the outer cylinder or side wall. However, by recirculating a temperature controlled liquid to the outer cylinder or side wall, It is possible to widen the temperature control range from a cooled state below room temperature to a heated state, and accordingly controllability of the inner cylinder or jacket temperature can be improved in this way.

Figure 9:
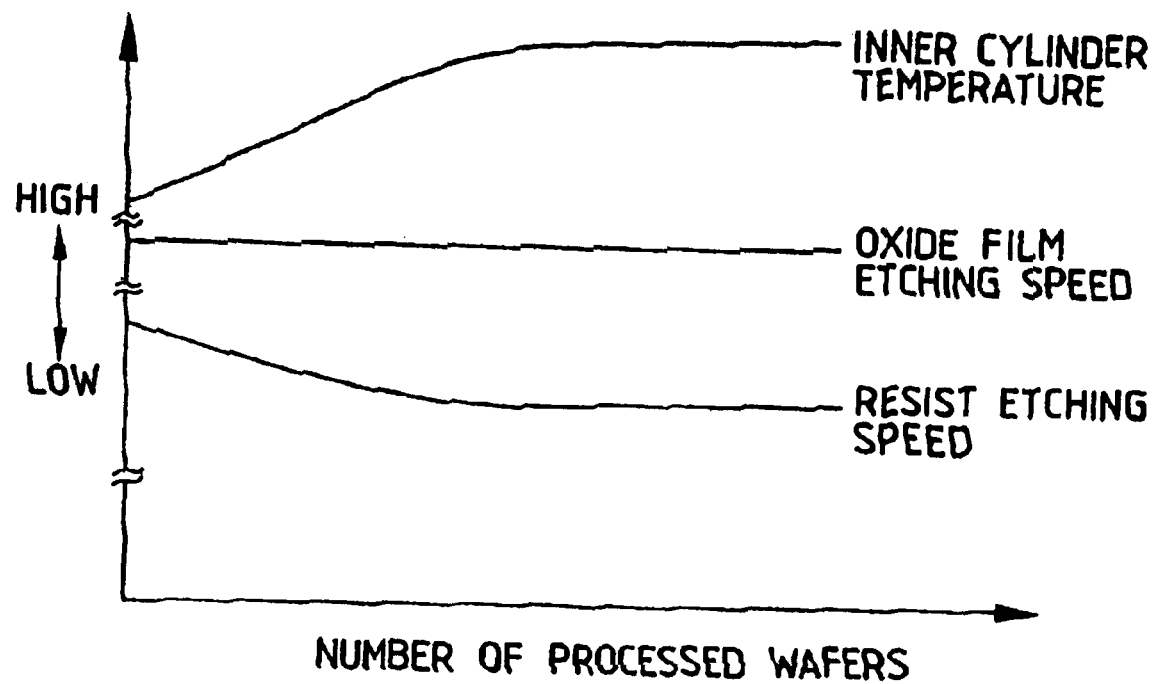
FIG. 9 is a graph showing the relationship between a number of processed wafers and the temperature of the inner cylinder or jacket of the processing chamber.

Further, application of the present invention Is not limited to the case where a process is stabilized by maintaining the temperature of the inner cylinder or jacket to a preset value. The present invention can be also applied to, for example, a case where an initial process change for a lot of wafers Is corrected by intentionally changing the temperature of the inner cylinder or jacket at the initial stage of the lot. That is, it is possible to stabilize a process by improving the temperature controllability for the inner cylinder or jacket during processing of the wafers of the lot as illustrated in FIG. 9.

The apparatuses described in the aforedescribed embodiments are used as follows.

Before starting operation of the apparatus, It is checked to determine whether or not the temperature of the inner cylinder or jacket can be controlled to a desired temperature.

Firstly, the Inside of the process chamber is evacuated to a preset pressure by action of the vacuum pump. Then, the heater is operated. The inner cylinder or jacket is heated by heat generation of the heater. The temperature of the heated inner cylinder or jacket is directly or indirectly detected and controlled to a desired temperature. By doing so, it can be confirmed that the temperature of the inner cylinder or jacket can be controlled to the desired temperature. If the temperature of the inner cylinder or jacket cannot be controlled to the desired temperature, operation of the heater is stopped. Then, the cause of the trouble is checked and repaired.

During processing, the temperature of the inner cylinder or jacket is monitored continuously or when required. The monitored temperature is compared with a preset desired temperature, and the temperature of the inner cylinder or jacket is controlled to the desired temperature based on the result of the comparison. The temperature control of the inner cylinder or jacket is performed.

In general, plural wafers are continuously processed one by one. In such a case, the temperature of the inner cylinder or jacket is monitored while processing one wafer among them until processing for the all plural wafers is completed to control the temperature to the desired temperature. For example, when trouble occurs in the temperature monitoring of the inner cylinder or jacket or when the temperature of the inner cylinder or jacket cannot be controlled to the desired temperature, it is judged that the processing characteristic of the wafer cannot be maintained stable and the wafer processing is stopped. Then, an effort is made to solve the problem, and the successive process for plural wafers is re-started.

The fact that trouble occurs in the temperature monitoring of the inner cylinder or jacket or that the temperature of the inner cylinder or jacket cannot be controlled to the desired temperature is indicated to an operator by output of some kind of alarm through the controller. In response to the alarm, the operator solves the trouble and re-starts the wafer processing. By monitoring the temperature control of the inner cylinder or jacket, the history of the processing up until the stopping of the wafer processing can be checked, and consequently the search of the cause and the repairing method can be performed property and fast.

A cleaning process is performed for the inside of the process chamber. The process is performed by wiping the inside surface of the process chamber, such as the surface of the inner cylinder or jacket, and the surfaces of parts arranged inside the process chamber, such as the sample table, or by utilizing a cleaning gas plasma. The process is performed before a wafer processing, in the intervals between processings, or after completion of a wafer processing.

In a case of performing a cleaning process by wiping, it is checked whether the temperature of the inner cylinder or jacket can be controlled during a period after completion of the cleaning processing and before the starting of a wafer processing. On the other hand, in a case of performing a cleaning process by utilizing a plasma, it is checked whether the temperature of the inner cylinder or jacket can be controlled during the cleaning processing or during a period after the cleaning process and before starting of a wafer processing.

Further, a discharge running-in (seasoning) process is performed for the inside of the process chamber. The seasoning process is performed before starting a wafer processing at the beginning of a day, or during a period after completion of a cleaning processing and before starting of a wafer processing. In this case, it may be checked during the seasoning process whether the temperature of the inner cylinder or jacket can be controlled or not.

In order to stabilize the characteristic of plasma processing over time, it is necessary to control the temperature of the inner cylinder or jacket to a temperature corresponding to a wafer processing condition. Here, the wafer processing conditions include the quality of film to be processed, the kind of processing gas to be used, the condition of discharge, the type of discharge and so on.

Therefore, wafer processing conditions are input to the controller of the processing apparatus from a higher level controlling unit or an operator. The controller has received an indication of the temperature of the inner cylinder or jacket corresponding to each of the wafer processing conditions. In the controller, the temperature of the inner cylinder or jacket corresponding to the input wafer processing condition is selected and set as a control temperature. On the other hand, a detected and monitored temperature of the Inner cylinder or jacket is input to the controller. The detected and monitored temperatures are compared with the control temperature, and the temperature of the inner cylinder or jacket is controlled to the control temperature based on the result of comparison.

Further, in a case where the wafer is, for example, of a multi-layer film structure, the temperature of the inner cylinder or jacket may be controlled to a temperature corresponding to that set for the quality of each film, the kind of process gas, the condition of discharge and so on. By doing so, the characteristic of plasma processing can be finely stabilized over time.

In a case where a wafer processing performance is varied during one lot processing after a running-in discharge (seasoning) process, the temperature of the inner cylinder or jacket may be varied along a desired temperature pattern in order to make the processing performance uniform.

According to the present invention, a plasma etching apparatus maintaining the reproducibility and reliability of the process at a low cost for a long period of time so as to prevent the etching characteristic from a change with time by controlling the inner temperature of the reactor and the wall surface condition can be provided.

What is claimed is:

1. A plasma processing method for processing a sample of one lot of a plurality of samples placed in a processing chamber by using plasma formed within an inner wall constituting at least a part of the processing chamber, the method comprising the steps of:

processing the samples of the lot while changing a temperature on at least a surface of the inner wall of the processing chamber upon processing of the samples at an initial stage of the lot so that the temperature on at least the surface of the inner wall of the processing chamber is not maintained at a substantially constant temperature upon processing of the samples at the initial stage of the lot.

2. A plasma processing method as defined in claim 1, wherein the temperature on at least the surface of the inner wall of the processing chamber is controlled by a temperature controller.

3. A plasma processing method as defined in claim 1, wherein the inner wall is an exchangeable member which is a cylindrical, the samples of the lot being processed while changing the temperature on an inside surface of the exchangeable cylindrical member.

4. A plasma processing method as defined in claim 1, further comprising the step of controlling the temperature on at least the surface of the inner wall of the processing chamber to a predetermined initial temperature before starting the processing of the samples of the lot.

5. A plasma processing method as defined in claim 2, further comprising the step of controlling the temperature on at least the surface of the inner wall of the processing chamber to a predetermined initial temperature before starting the processing of the samples of the lot.

6. A plasma processing method as defined in claim 3, further comprising the step of controlling the temperature on at least the surface of the inner wall of the processing chamber to a predetermined initial temperature before starting the processing of the samples of the lot.

7. A plasma processing method as defined in claim 1, wherein the samples are processed by controlling the temperature on at least the surface of the inner wall of the processing chamber in accordance with a predetermined temperature pattern providing different set temperatures as the processing of the samples at the initial stage of the lot progresses.

8. A plasma processing method as defined in claim 7, further comprising the step of controlling the temperature on at least the surface of the inner wall of the processing chamber to a predetermined initial temperature before starting the processing of the samples of the lot.

9. A plasma processing method as defined in claim 1, wherein the samples are processed by controlling the temperature on at least an inner surface of the inner wall of the processing chamber, the inner wall being an exchangeable member.

10. A plasma processing method as defined in claim 9, further comprising the step of controlling the temperature on at least the inner surface of the inner wall of the processing chamber to a predetermined initial temperature before starting the processing of the samples of the lot.

* * * * *